US009673269B2

United States Patent
Defay et al.

(10) Patent No.: US 9,673,269 B2
(45) Date of Patent: Jun. 6, 2017

(54) INTEGRATED CAPACITOR COMPRISING AN ELECTRICALLY INSULATING LAYER MADE OF AN AMORPHOUS PEROVSKITE-TYPE MATERIAL AND MANUFACTURING PROCESS

(75) Inventors: Emmanuel Defay, Voreppe (FR);
Gwenaël Le Rhun, Renage (FR);
Aurélien Suhm, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/225,451

(22) Filed: Sep. 4, 2011

(65) Prior Publication Data
US 2012/0056299 A1 Mar. 8, 2012

(30) Foreign Application Priority Data
Sep. 3, 2010 (FR) ..................................... 10 03527

(51) Int. Cl.
*H01L 21/02* (2006.01)
*H01G 4/005* (2006.01)
*H01L 49/02* (2006.01)

(52) U.S. Cl.
CPC .............. *H01L 28/55* (2013.01); *H01L 28/40* (2013.01); *H01L 28/65* (2013.01); *H01L 21/02197* (2013.01); *H01L 21/02282* (2013.01)

(58) Field of Classification Search
CPC ... H01L 28/40; H01L 28/55; H01L 21/02197; H01L 21/02282

(Continued)

(56) References Cited

U.S. PATENT DOCUMENTS 7,446,363 B2 * 11/2008 Agarwal ........... H01L 21/02183
257/296
7,785,977 B2 * 8/2010 Nomura .................... H01G 2/10
257/52

(Continued)

FOREIGN PATENT DOCUMENTS

EP 1 217 658 A2 6/2002

OTHER PUBLICATIONS

Yuhuan Xu, et al., "Electrical Characterizations of Polycrystalline and Amorphous Thin Films of Pb(ZrxTi1-x)O3 and BaTiO3 Prepared by Sol-Gel Technique", Journal of Non-Crystalline Solids, Oct. 2, 1994, pp. 1-17, vol. 176, No. 1, North-Holland Physics Publishing, Amsterdam, NL, XP024061984.

(Continued)

*Primary Examiner* — David Vu
*Assistant Examiner* — Brandon Fox
(74) *Attorney, Agent, or Firm* — Baker & Hostetler LLP

(57) ABSTRACT

An integrated capacitor comprises a layer of dielectric material known as functional dielectric material based on crystallized material of perovskite type, between at least one first electrode known as a bottom electrode at the surface of a substrate and at least one second electrode known as a top electrode, said electrodes being electrically insulated by a layer of electrically insulating material in order to allow at least one contact on the top electrode. The electrically insulating material is made of an amorphous dielectric material of perovskite type having a dielectric constant lower than that of the crystallized material of perovskite type. The contact is formed from an etched contacting layer in contact with the electrically insulating dielectric layer level with its surface parallel to the plane of the layers. A process for manufacturing such an integrated capacitor is also provided.

15 Claims, 7 Drawing Sheets

(58) Field of Classification Search
USPC .......................... 257/532, E21.008; 361/303
See application file for complete search history.

(56) References Cited

U.S. PATENT DOCUMENTS

| | | | | |
|---|---|---|---|---|
| 7,795,739 | B2* | 9/2010 | Kurihara | H01L 21/4853 257/774 |
| 2001/0001488 | A1 | 5/2001 | Eastep et al. | |
| 2002/0175361 | A1 | 11/2002 | Fox et al. | |
| 2004/0130849 | A1* | 7/2004 | Kurihara | H01G 4/228 361/311 |
| 2006/0246675 | A1* | 11/2006 | Basceri | 438/381 |
| 2007/0034989 | A1* | 2/2007 | Shioga | H01G 4/33 257/532 |
| 2007/0196932 | A1 | 8/2007 | Fujiki et al. | |
| 2011/0061215 | A1 | 3/2011 | Defay et al. | |
| 2011/0080069 | A1 | 4/2011 | Cueff et al. | |
| 2011/0311718 | A1* | 12/2011 | Palanduz | B82Y 30/00 427/80 |
| 2012/0007666 | A1 | 1/2012 | David et al. | |

OTHER PUBLICATIONS

Wen Gong, et al., "Effect of Pyrolysis Temperature on Preferential Orientation and Electrical Properties of Sol-Gel Derived Lead Zirconate Titanate Films", Journal of the European Ceramic Society, Sep. 1, 2004, pp. 2977-2982, vol. 24, No. 10-11, Elsevier Science Publishers, Barking Essex, GB, XP004504401.

K.D. Budd, et al., "Sol-Gel Processing of PbTiO3, PbZrO3, PZT, and PLZT Thin Films", Department of Ceramic Engineering and Materials Research Laboratory, University of Illinois at Urbana-Champaign, pp. 107-121.

Stephen R. Gurkovich, et al, "Preparation of Monolithic Lead-Titanate by a Sol-Gel Process", Ultrastructure Processing of Ceramics, Glasses and Composites, 1984, pp. 152-160, Wiley-Interscience, New York.

* cited by examiner

INTEGRATED CAPACITOR COMPRISING AN ELECTRICALLY INSULATING LAYER MADE OF AN AMORPHOUS PEROVSKITE-TYPE MATERIAL AND MANUFACTURING PROCESS

CROSS-REFERENCE TO RELATED APPLICATION

This application claims priority to foreign French patent application No. FR 1003527, filed on Sep. 3, 2010, the disclosure of which is incorporated by reference in its entirety.

FIELD OF THE INVENTION

The field of the invention is that of components of integrated capacitor type comprising a dielectric layer between a top electrode and a bottom electrode and with a contact, necessitating the use of an electrical insulator between the two types of electrodes.

BACKGROUND

Typically, this type of component may be used within the context of piezoelectric actuators, notably for active optics or actuators for inkjet printers. Such components may also be used for producing resonators and acoustic radio-frequency filters that use a piezoelectric effect for mobile telephony. They are also advantageous for producing ferroelectric variable capacitors, very high value capacitors used for mobile telephony or mobile articles in general (pacemakers, communicating articles).

Currently, to produce planar technology integrated capacitors (referred to as MIM, for Metal Insulator Metal, capacitors), it is necessary to make the electrical contacts on the electrodes. Indeed, a typical structure of an MIM capacitor comprises a layer of dielectric known as functional dielectric DF sandwiched between two electrodes Es and Ei, the bottom electrode being on the surface of a substrate S covered with an insulating layer Ci as illustrated in FIG. 1.

To make the contacts via a contacting layer $RC_{sup}$ and $RC_{inf}$, and to avoid short-circuiting between the top and bottom electrodes, it is necessary to use an insulating dielectric DI as illustrated in FIG. 2.

This insulating dielectric may be a silicon oxide $SiO_2$ deposited by PECVD, by sputtering, or by spin-coating, commonly identified by the acronym "SOG" for "Spin-on Glass" for example. This may also be a silicon nitride $Si_xN_y$, deposited by PECVD, LPCVD for example, it could just as well be other insulating materials such as the following compounds: $Ta_2O_5$, $Al_2O_3$, MgO, AlN, etc.

One constraint for this insulating dielectric DI is that it must not disturb the operation of the functional dielectric DF. In particular, it is important that the capacitance that it adds in parallel to the device is negligible relative to the functional capacitance. In order to do this, the prior art uses an insulating dielectric DI of low dielectric constant relative to the functional dielectric DF.

For example, if the functional dielectric DF is $Pb(Zr,Ti)O_3$ (PZT), the dielectric constant of which is typically equal to 1000, it is common to use a silicon oxide as insulating dielectric DI, the dielectric constant of which is equal to 4. Thus, the capacitance added by the $SiO_2$ will be much lower than the capacitance of PZT, at a given equivalent surface area.

For PZT and other oxides having a very high permittivity, the use of the insulating dielectric DI may present a problem of reliability. Indeed, Bouyssou et al. (thesis of Emilien Bouyssou, p. 20, thesis of the University of Tours, 2006) observed that the $SiO_2$ used as insulating dielectric DI is the cause of the appearance of brittleness in PZT capacitors, more precisely of a premature ageing of the capacitors in a constant voltage stress test. This is explained by the hydrogenated compounds used during CVD depositions of insulating dielectrics DI, the most commonly used method in the industry and notably illustrated in FIG. 3, covered with a USG (Undoped Silicon Glass) layer with a contact Rc.

SUMMARY OF THE INVENTION

Within this context, one subject of the present invention is a component of the integrated capacitor type using an electrically insulating dielectric that does not have the aforementioned drawbacks and for which the manufacturing process proves to be particularly advantageous.

More specifically, one subject of the present invention is an integrated capacitor comprising a layer of dielectric material known as functional dielectric material based on crystallized material of perovskite type, between at least one first electrode known as a bottom electrode at the surface of a substrate and at least one second electrode known as a top electrode, said electrodes being electrically insulated by a layer of electrically insulating material in order to allow at least one contact on the top electrode, characterized in that:

the electrically insulating material is made of an amorphous dielectric material of perovskite type having a dielectric constant lower than that of the crystallized material of perovskite type; and the contact is formed from an etched contacting layer in contact with the electrically insulating dielectric layer level with its surface parallel to the plane of the layers.

According to one variant of the invention, the electrically insulating material is placed on or under the top electrode.

According to one variant of the invention, the crystallized functional dielectric material is an oxide from among the following oxides: $Pb(Sr,Ti)O_3$, $SrTiO_3$, $(Ba,Sr)TiO_3$, $(Pb,La)(Zr,Ti)O_3$, $Pb(Mg,Nb,Ti)O_3$, $Pb(Zn,Nb,Ti)O_3$, $BiFeO_3$, $BaTiO_3$.

According to one variant of the invention, the amorphous electrically insulating dielectric material is an oxide from among the following oxides: PZT, $SrTiO_3$, $(Ba,Sr)TiO_3$, $(Pb,La)(Zr,Ti)O_3$, $Pb(Mg,Nb,Ti)O_3$, $Pb(Zn,Nb,Ti)O_3$, $BiFeO_3$, $BaTiO_3$.

According to one variant of the invention, the functional and electrically insulating dielectric materials have the same chemical composition.

According to one variant of the invention, the electrodes are made of platinum or of ruthenium, or of ruthenium oxide, or of iridium, or of iridium oxide, or of gold.

According to one variant of the invention, the substrate is made of silicon and comprises an upper oxide layer.

According to one variant of the invention, the capacitor also comprises an adhesion layer between the substrate and the bottom electrode layer.

Another subject of the invention is a process for manufacturing an integrated capacitor according to the invention, characterized in that it comprises at least one step of producing a layer of amorphous and electrically insulating dielectric material, on top of or underneath the top electrode, via a sol-gel process comprising:
spreading a sol-gel solution;
drying said solution at a temperature between around 100° C. and 150° C.; and
pyrolysis of said dried solution at a temperature between around 300° C. and 500° C. resulting in the amorphous insulating dielectric material.

According to one variant of the invention, the process comprises at least:
one step of producing a layer of crystallized functional dielectric material ($DF_{cris}$) between the bottom electrode and the top electrode via a sol-gel process comprising:
spreading a sol-gel solution on the surface of a substrate comprising a bottom electrode;
drying said solution at a temperature between around 100° C. and 150° C.;
pyrolysis of said dried solution at a temperature between around 300° C. and 500° C. resulting in an amorphous functional dielectric material; and
crystallization of said amorphous functional material brought to a temperature greater than or equal to the crystallization temperature of said material so as to obtain the crystallized functional dielectric material ($DF_{cris}$).

According to one variant of the invention, the crystallization is carried out by rapid thermal annealing (RTA).

Thus, the present invention notably advantageously proposes to use a process of sol-gel type in a method which may appear to be a "degraded" method that does not give crystallized layers for the amorphous material, since the implementation of the latter stops after the calcination step, without implementing the crystallization step, which requires an annealing operation at higher temperature.

BRIEF DESCRIPTION OF THE DRAWINGS

The invention will be better understood and other advantages will appear on reading the following description given non-limitingly and owing to the appended figures, among which.

DETAILED DESCRIPTION

According to the invention, it is proposed to use a sol-gel process that makes it possible to produce components having a high permittivity dielectric layer and a layer of material having a lower permittivity providing an electrically insulating role between the two types of electrodes known as bottom and top electrodes.

In the case of very high permittivity materials, a well-known technique is the sol-gel process and notably of sol-gel polymerization type. The sol-gel deposition of $PbTiO_3$ (PT) was reported for the first time in 1984 by GURKOVICH S. R., Blum J. B., *Preparation of monolithic lead-titanate by sol-gel process, in Ultrastructure Processing of Ceramics, Glasses and Composites*, L. L. Ha. D. R. Ulrich, Editor, Wiley-Interscience: New-York, 152-160, 1984.

Figure 4A:
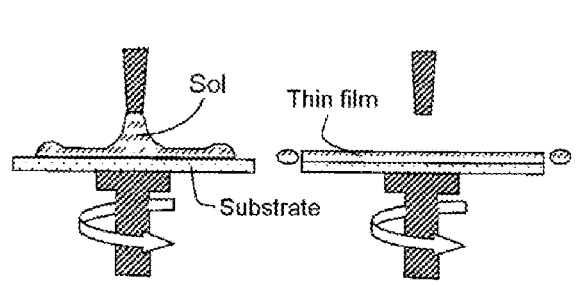
FIGS. 4a and 4b illustrate two examples of processes for sol-gel-type spreading onto a substrate by spin-coating and by dip-coating.
Figure 4B:
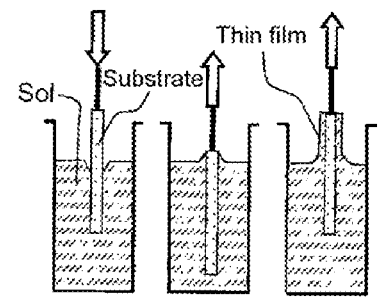

The following year, Budd et al., BUDD K. D., Dey S. K., PAYNE D. A., *Sol-gel processing of PT, PZ, PZT and PLZT thin films*. Br. Ceram. Proc. 107-121, 1985, described the synthesis of perovskite thin films based on lead (PT, PZ, PZT, PLZT). This process uses a solution containing reactive precursors such as metal salts or alkoxides, and a solvent. The deposition of thin films may take place by spin-coating or else by dip-coating as illustrated in FIGS. 4a and 4b.

The principle of the sol-gel process is based on a succession of hydrolysis-condensation reactions, at a temperature close to ambient temperature, which results in the formation of an inorganic polymer, which may then be heat treated. The step of hydrolysing metal alkoxides is shown schematically by the following reaction:

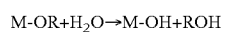

where M is a metal cation, and R an alkyl organic group. This reaction allows the conversion of the alkoxy functions to hydroxyl functions. The solution obtained is called a sol; that is to say a solid phase, constituted of small entities, dispersed in a liquid (the solvent). The hydroxyl functions are then converted to M-O-M species corresponding to the formation of an inorganic macromolecular network constituting the gel. This takes place following several condensation reactions (formation of oxo, —O—, bridges by oxolation) reactions, with removal of alcohol and of water.

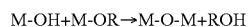

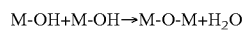

The production of piezoelectric films via the sol-gel technique consists of a succession of steps of spreading the sol-gel solution and of heat treatments. For example, a succession of steps of spreading of sol-gel, drying (at 100° C.-150° C.), pyrolysis (at 300° C.-500° C.), and crystallization (at 600° C.-800° C.).

The solution is customarily spread over a substrate by spin-coating. The film thickness deposited depends mainly on the speed of rotation of the spin coater and on the physicochemical parameters of the solution (viscosity, concentration, evaporation rate). A drying step makes it possible to evaporate a portion of the solvents and to obtain a solid deposit. The layer then undergoes a pyrolysis (or calcination) in order to remove the organic residue.

This step, generally carried out on a hotplate, is crucial since it considerably conditions the structural quality of the piezoelectric film. The calcination temperature must be high enough in order to remove all of the organic residue (typically between 300° C. and 450° C.). Otherwise, the trapping of organic matter may lead to the presence of porosities. However, too high a temperature risks promoting the appearance of a parasitic phase, such as pyrochlore in the case of PZ, described in the publication: GONG W., L J. F., CHu X., LI L., J. Eur. Ceram. Soc. 24, 2977-2982, 2004.

After pyrolysis, the amorphous layer obtained is crystallized and densified at a temperature between 600° C. and 800° C. This crystallization step is usually carried out by rapid thermal annealing (RTA), rather than by conventional annealing, in order, notably, to limit the thermal budget. The rapid thermal annealing (RTA) process is today among the most-used processes for the crystallization of thin films. Its main asset is a transmission of thermal energy via radiation and not by convection. This results in extremely rapid temperature rises which may reach up to 300° C./s owing to the use of halogen lamps. The annealing operations last a few tens of seconds. The thickness of a layer after crystallization is generally around 50 nm. Depending on the final material thickness desired, it is necessary to repeat all of the steps described previously several times. However, the crystallization step is very often carried out every two or three layers pyrolysed. The advantage of using the RTA process in order to reduce both the thermal budget and the manufacturing time of the films is then understood.

The sol-gel process has the advantage of being inexpensive and relatively simple to implement, requiring only a spreading area, hotplates and an RTA furnace. Furthermore, it does not require significant maintenance, which is a considerable asset compared to vacuum deposition techniques. It is furthermore very flexible for the development of complex materials. It is thus possible to easily vary the compositions by means of metering the organometallic precursors, or else to incorporate dopants in order to optimize the properties of the films.

Generally, the material deposited by the sol-gel process undergoes several steps. After pyrolysis, the material has been stripped of all its organic compounds (therefore H and C). The resulting material is therefore exclusively composed of non-organic materials after this pyrolysis (sometimes called calcination). As the material is not crystallized, it does not have a very high dielectric constant.

Figure 1:
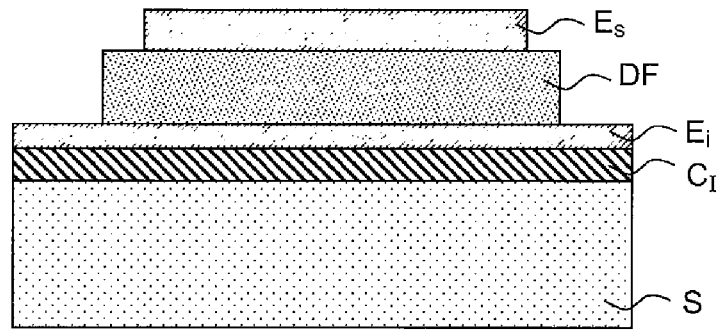
FIG. 1 illustrates an example of an MIM capacitor structure according to the known art.
Figure 2:
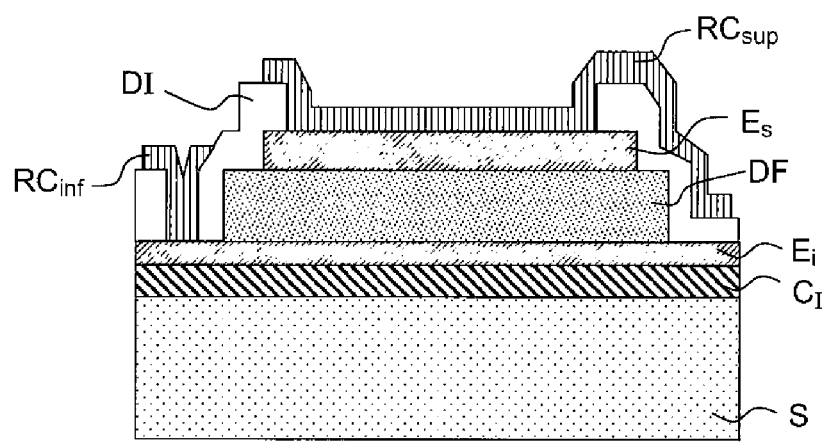
FIG. 2 illustrates an example of the use of an insulating dielectric to make the contacts on the MIM capacitor according to the known art.
Figure 3:
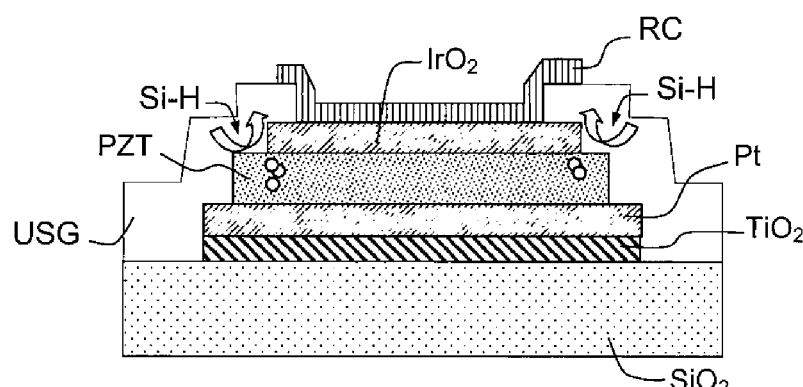
FIG. 3 illustrates the appearance of defects in the PZT, due to the presence of hydrogen in an undoped silicon glass.

The present invention proposes to exploit this property of lower dielectric constant in order to use this layer referred to as a calcined or pyrolysed layer, as an insulating dielectric DI as illustrated in FIG. 2. This has the advantage of making it possible to use a single material as insulating dielectric DI and functional dielectric DF, the insulating dielectric DI does not have hydrogenated compounds capable of weakening the properties of the functional dielectric DF, the dielectric constant of the insulating dielectric DI remains low compared to that of the functional dielectric DF (typically, for PZT, the dielectric constant of the non-crystallized calcined PZT lies between 20 and 30, whereas the dielectric constant of the crystallized PZT lies between 400 and 1500).

Example of an Implementation Process According to the Invention

Figure 5A:
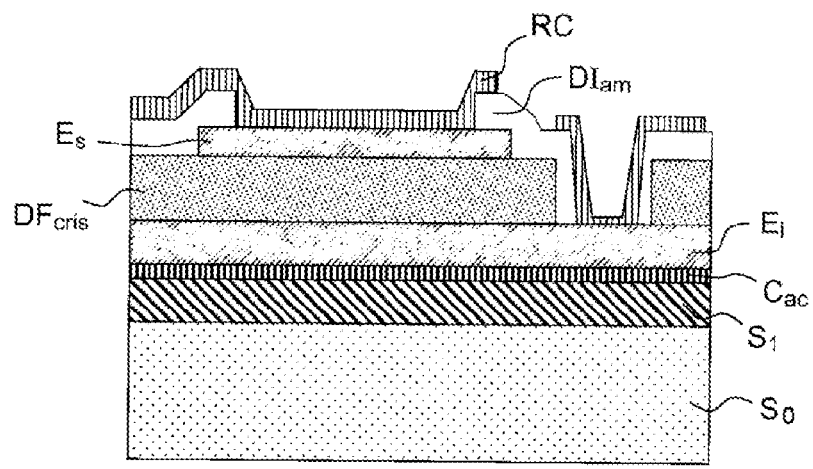
FIGS. 5a and 5b illustrate an example of a multilayer for a high permittivity capacitor according to the invention with an unetched or etched bottom electrode; and
steps 6a to 6k illustrate the various steps of a process for manufacturing an integrated capacitor according to the invention.
Figure 5B:
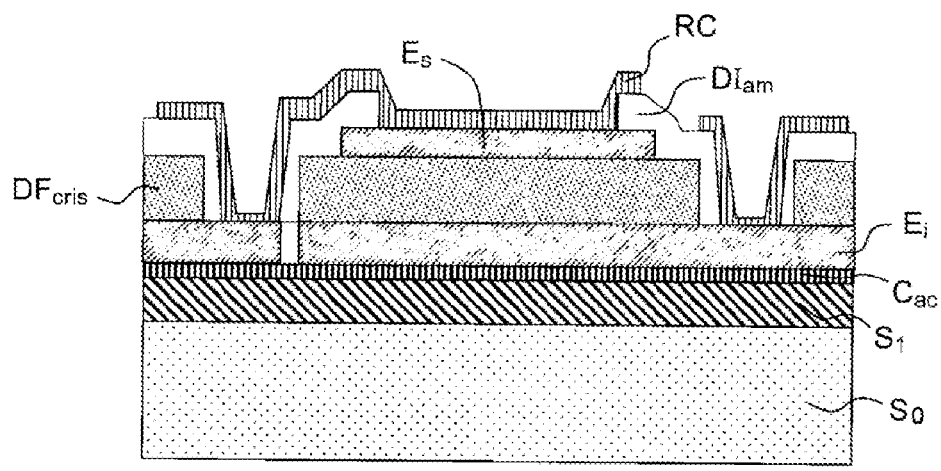

The integrated capacitor according to the invention comprises, in this example, a functional dielectric material of perovskite type having a high dielectric constant, which may notably be PZT, and an electrical insulator of dielectric type of amorphous perovskite type, which has not undergone a final crystallization annealing phase, between the bottom electrode and the top electrode, as illustrated in FIG. 5, which shows one possible multilayer for a very high value integrated capacitor using PZT as insulating dielectric $DI_{am}$ (calcined) and functional dielectric $DF_{cris}$ (crystallized), starting from a substrate $S_0$ covered with an oxide layer $S_1$ and an adhesion layer $C_{ac}$ and comprising a bottom electrode Ei and a top electrode Es.

The various steps of the process are described below with the aid of FIGS. 6a to 6k.

Figure 6A:
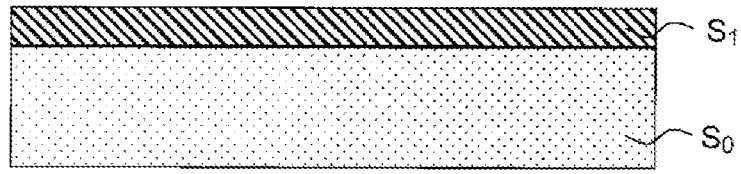

In order to produce such a multilayer, it is possible to use a silicon substrate $S_0$, typically 200 mm in diameter. An oxidation step is carried out that defines a surface layer $S_1$ of $SiO_2$ having a thickness of 500 nm, as illustrated in FIG. 6a. This makes it possible to prevent diffusions towards the substrate.

An adhesion layer $C_{ac}$ is then deposited by sputtering of 5 nm of titanium Ti followed by an oxidation, by rapid thermal annealing, of 2 minutes at 750° C. under oxygen $O_2$. This adhesion layer may also be made of tantalum Ta.

Figure 6B:
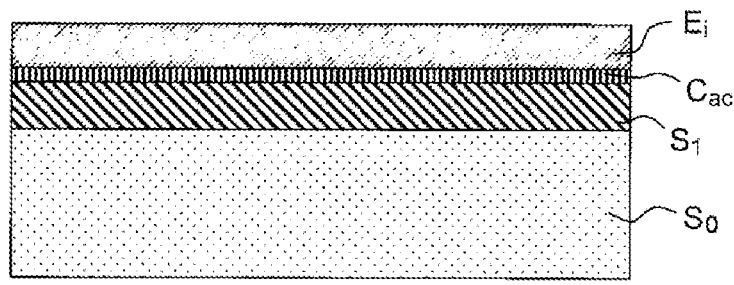

The bottom electrode Ei as illustrated in FIG. 6b, made of Pt (100 nm) is deposited by sputtering. This electrode may also be made of iridium. The bottom electrode may or may not be etched, for example by ion milling in accordance with a suitable pattern.

Figure 6C:
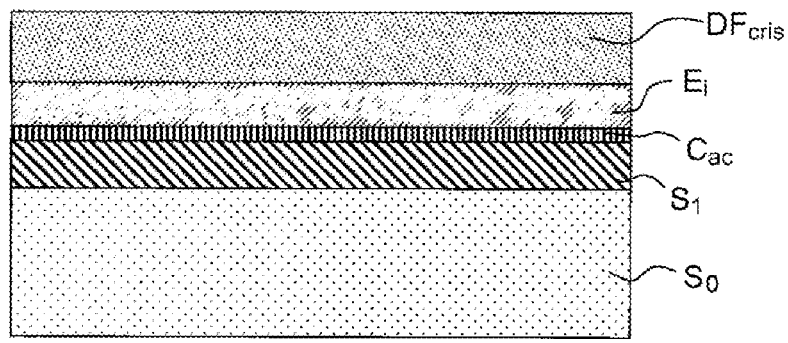

The functional dielectric made of PZT is then prepared via the sol-gel process as mentioned in the reaction scheme described previously, which is referenced $DF_{cris}$ and is illustrated in FIG. 6c. Typically, 200 nm of PZT can be deposited by carrying out at least one spin-coating deposition, followed by a drying operation at 110° C. for 5 minutes on a hotplate, and a pyrolysis step at 350° C. for 5 minutes on a hotplate. In the case of the use of successive depositions in order to obtain the desired thickness of PZT, each deposition is followed by a drying and pyrolysis operation before the next deposition.

A final crystallization annealing operation is then carried out at 700° C. in air for 30 seconds. Generally, this annealing should be carried out every 3 PZT deposition/drying/pyrolysis operations.

It is possible to use materials other than PZT, having a very high permittivity, which may notably be one of the following oxides: $SrTiO_3$, $(Ba,Sr)TiO_3$, $(Pb,La)(Zr,Ti)O_3$, $Pb(Mg,Nb,Ti)O_3$, $Pb(Zn,Nb,Ti)O_3$, $BiFeO_3$, $BaTiO_3$.

Figure 6D:
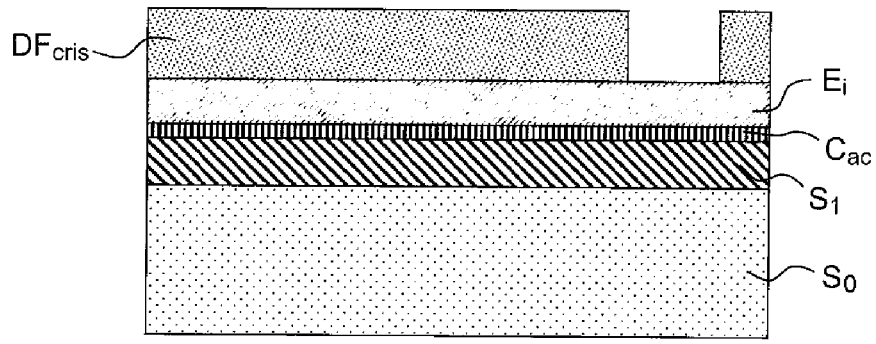

The PZT is then etched by a wet etching process based on the following preparation: HF at 1%, HCl at 37% in water and in the following relative proportions: 5/9/50. This etching may also be carried out by dry etching using RIE (Reactive Ion Etching) equipment with gases of chlorinated type with addition of argon as illustrated in FIG. 6d. This etching is defined using, prior to the etching, a photoresist defined by a photolithography step using a dedicated mask.

Figure 6E:
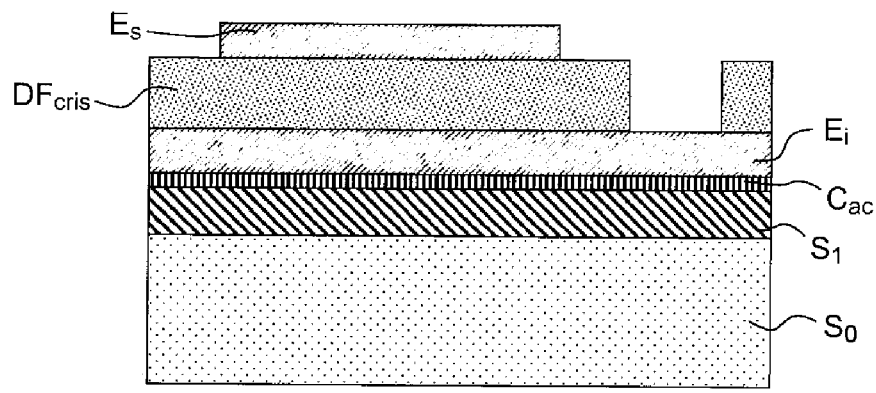

The top electrode Es made of Pt and having a thickness typically of 100 nm, as illustrated in FIG. 6e, is then deposited by sputtering. This electrode may equally well be made of ruthenium, or ruthenium oxide, made of iridium, or made of iridium oxide, or else made of gold. This electrode is etched by ion milling. This etching is defined using, prior to the etching, a photoresist defined by a photolithography step using a dedicated mask.

Figure 6F:
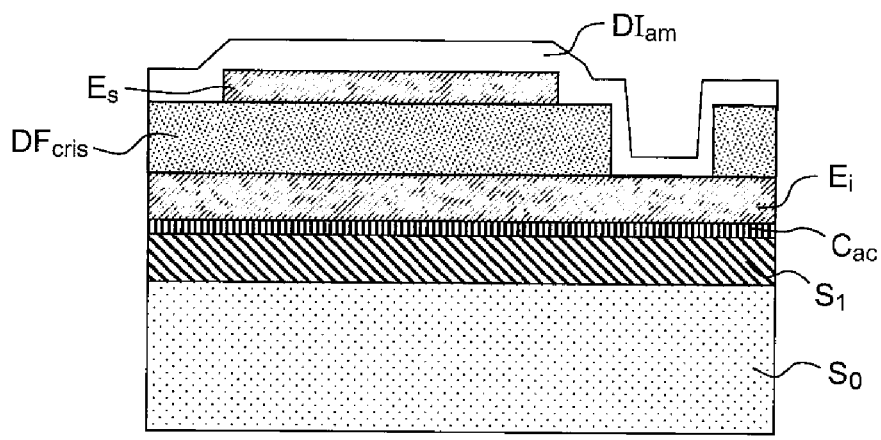

The insulating dielectric, referenced $DI_{am}$, and illustrated in FIG. 6f is then deposited by the sol-gel process but not carrying out the final crystallization step. In this case, use is made of PZT or of other materials which may notably be $SrTiO_3$, $(Ba,Sr)TiO_3$, $(Pb,La)(Zr,Ti)O_3$, $Pb(Mg,Nb,Ti)O_3$, $Pb(Zn,Nb,Ti)O_3$, $BiFeO_3$, $BaTiO_3$. Typically, the insulating dielectric layer may have a thickness of the order of 400 nm approximately, obtained by six calcined depositions carried out by spin-coating, followed by a drying operation at 110° C. for 5 minutes on a hotplate, followed by a pyrolysis operation at 350° C. for 5 minutes on a hotplate, repeated six times. It is possible to reduce or increase the thickness by reducing or increasing the number of depositions (spin-coating+drying at 110° C. for 5 minutes on hotplate+pyrolysis at 350° C. for 5 minutes on hotplate) or the viscosity of the sol-gel liquid.

Figure 6G:
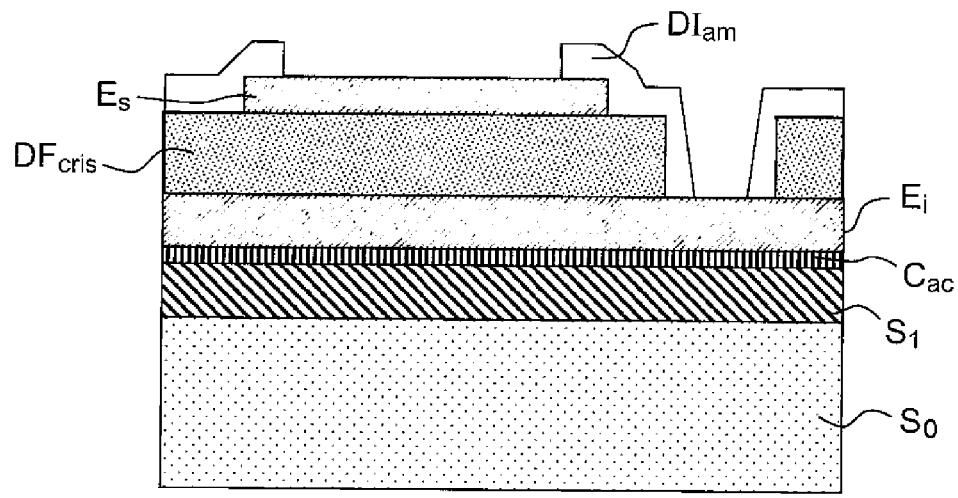

This insulating dielectric is then etched by a wet etching process based on the preparation: 1% HF-37% HCl—$H_2O$ in the proportions 5/9/200. This etching is defined using, prior to the etching, a photoresist defined by a photolithography step using a dedicated mask as illustrated in FIG. 6g.

Figure 6H:
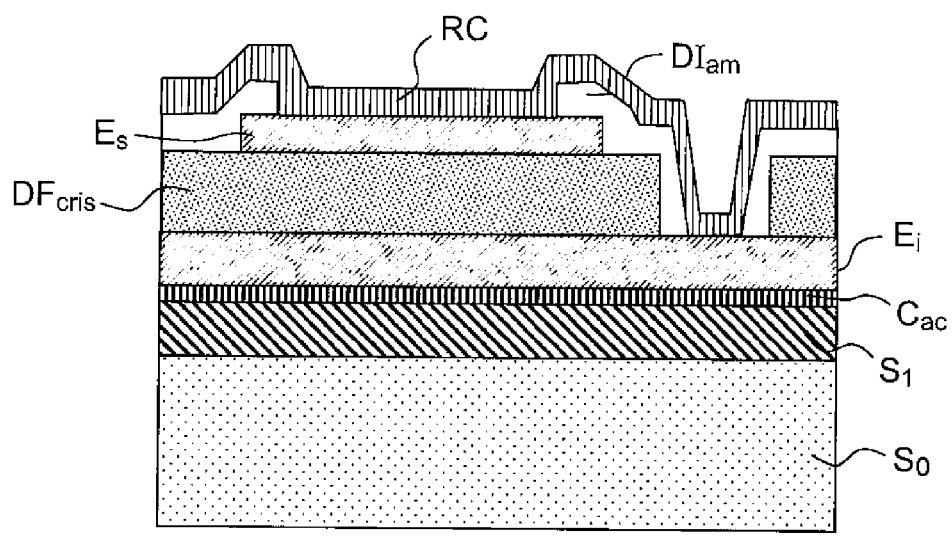

A metal is then deposited to make the contact Rc as illustrated in FIG. 6h. This metal may, non-limitingly, be Al, Al/Cu, Al/Si, Cu, Pt, etc. Notably it is possible to use an Al/1% Cu alloy having a thickness of 1 μm, deposited by sputtering.

Figure 6I:
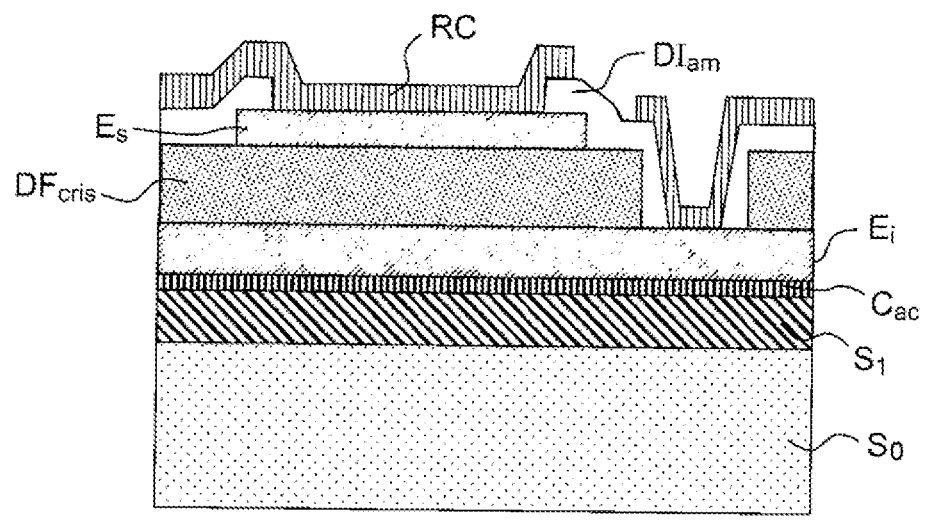

This layer is then etched by a wet or dry etching process as illustrated in FIG. 6i. This etching is defined using, prior to the etching, a photoresist defined by a photolithography step using a dedicated mask.

Figure 6J:
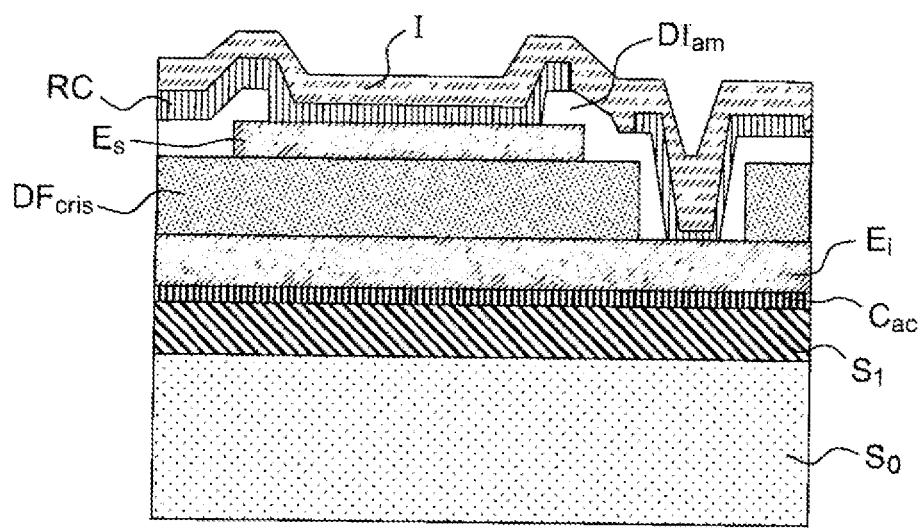
Figure 6K:
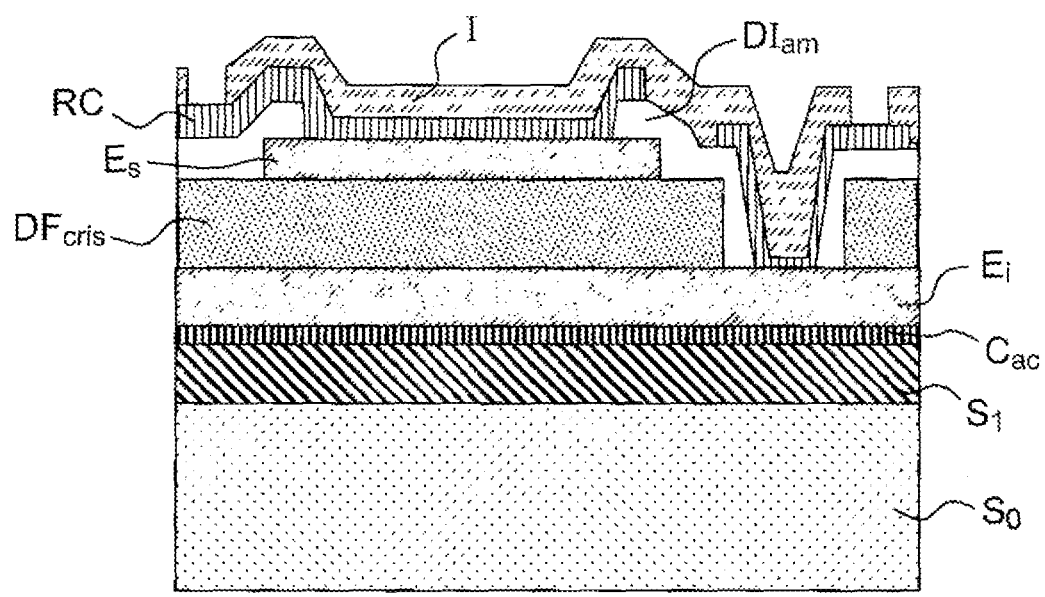

Finally, a protective insulating layer I as illustrated in FIG. 6j is deposited, which is etched in order to access the contact layer Rc as illustrated in FIG. 6k.

The invention claimed is:

1. An integrated capacitor, comprising:
   a layer of dielectric material known as a functional dielectric material based on a crystallized material of perovskite type, between at least one first electrode known as a bottom electrode above a surface of a substrate and at least one second electrode known as a top electrode above the bottom electrode;
   an etched contacting layer having a first region over a surface of the top electrode, a second region that extends horizontally beyond a first edge of the top electrode, a third region over a surface of the bottom electrode, and a fourth region that extends horizontally beyond a second, opposing edge of the top electrode;
   a layer of electrically insulating material over the top electrode, the layer of electrically insulating material defining a first contact between the first region of the etched contacting layer and the surface of the top electrode and a third contact between the third region of the etched contacting layer and the surface of the bottom electrode; and
   a protective insulating layer over the etched contacting layer, the protective insulating layer being etched to define a second contact in the second region of the etched contacting layer entirely horizontally beyond the first edge of the top electrode and a fourth contact in the fourth region of the etched contacting later entirely horizontally beyond the second, opposing edge of the top electrode, wherein:
      the electrically insulating material comprises an amorphous dielectric material of perovskite type having a dielectric constant lower than that of the crystallized material of perovskite type,
      a surface of the first contact is parallel to a plane of the layer of dielectric material, and
      the amorphous dielectric material comprises an oxide selected from the group consisting of PZT, $SrTiO_3$, $(Pb,La)(Zr,Ti)O_3$, $Pb(Mg,Nb,Ti)O_3$, $Pb(Zn,Nb,Ti)O_3$, and $BiFeO_3$.

2. The integrated capacitor according to claim 1, wherein the crystallized functional dielectric material is an oxide selected from the group consisting of $Pb(Sr,Ti)O_3$, $SrTiO_3$, $(Ba,Sr)TiO_3$, $(Pb,La)(Zr,Ti)O_3$, $Pb(Mg,Nb,Ti)O_3$, $Pb(Zn,Nb,Ti)O_3$, $BiFeO_3$, and $BaTiO_3$.

3. The integrated capacitor according to claim 1, wherein a chemical composition of the functional dielectric material is the same as a chemical composition of the electrically insulating dielectric material.

4. The integrated capacitor according to claim 1, wherein the electrodes are made of platinum, ruthenium, ruthenium oxide, iridium, iridium oxide, or gold.

5. The integrated capacitor according to claim 1, wherein the substrate is made of silicon and comprises an upper oxide layer.

6. The integrated capacitor according to claim 1, further comprising an adhesion layer disposed between the substrate and the bottom electrode.

7. A process for manufacturing an integrated capacitor according to claim 1, comprising at least one step of producing the layer of electrically insulating material, on top of or underneath the top electrode, via a sol-gel process comprising:
   spreading a sol-gel solution;
   drying said solution at a temperature between around 100° C. and 150° C.; and
   pyrolysis of said dried solution at a temperature between around 300° C. and 500° C. resulting in the amorphous dielectric material.

8. The process for manufacturing the integrated capacitor according to claim 7, further comprising at least one step of producing the layer of dielectric material via a sol-gel process comprising:
   spreading a sol-gel solution on the surface of a substrate comprising a bottom electrode;
   drying said solution at a temperature between around 100° C. and 150° C.;
   pyrolysis of said dried solution at a temperature between around 300° C. and 500° C. resulting in the functional dielectric material; and
   crystallization of said functional dielectric material brought to a temperature greater than or equal to the crystallization temperature of said material to obtain the crystallized functional dielectric material.

9. The process for manufacturing an integrated capacitor according to claim 8, wherein the crystallization is carried out by rapid thermal annealing.

10. The integrated capacitor according to claim 1, wherein the first contact overlaps with the bottom electrode.

11. The integrated capacitor according to claim 10, wherein the second contact overlaps with the bottom electrode.

12. The integrated capacitor according to claim 1, wherein a surface of the second contact is parallel to the plane of the layer of dielectric material.

13. The integrated capacitor according to claim 1, wherein at least part of the protective insulating layer is directly over and in contact with the layer of electrically insulating material.

14. The integrated capacitor according to claim 1, wherein an entirety of the first contact does not overlap with an entirety of the second contact.

15. The integrated capacitor according to claim 14, wherein an entirety of the third contact does not overlap with an entirety of the fourth contact.

* * * * *